(12) United States Patent
Wang

(10) Patent No.: US 6,465,348 B1
(45) Date of Patent: Oct. 15, 2002

(54) METHOD OF FABRICATING AN MOCVD TITANIUM NITRIDE LAYER UTILIZING A PULSED PLASMA TREATMENT TO REMOVE IMPURITIES

(75) Inventor: Yu-Piao Wang, Chung-Li (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/875,506

(22) Filed: Jun. 6, 2001

(51) Int. Cl.[7] .............................................. H01L 21/443
(52) U.S. Cl. ...................... 438/681; 438/653; 438/685
(58) Field of Search ................................ 438/474, 475, 438/653, 681, 685; 427/535

(56) References Cited

U.S. PATENT DOCUMENTS

| | | | |
|---|---|---|---|
| 5,661,115 A | * | 8/1997 | Sandhu ........................ 427/534 |
| 5,773,363 A | * | 6/1998 | Derderian et al. .......... 438/672 |
| 5,899,725 A | * | 5/1999 | Harshfield ................... 438/398 |
| 5,970,378 A | * | 10/1999 | Shue et al. .................. 438/656 |
| 6,060,389 A | * | 5/2000 | Brennan et al. ............ 438/643 |
| 6,086,960 A | * | 7/2000 | Kim et al. ................... 427/534 |

OTHER PUBLICATIONS

S. Riedel et al., "Investigation of the Plasma Treatment in a Multistep TiN MOCVD Process," Microelectronic Engineering, vol. 50, pp. 533–540, Jan. 2000.*

* cited by examiner

Primary Examiner—Olik Chaudhuri
Assistant Examiner—Stephen W. Smoot
(74) Attorney, Agent, or Firm—Winston Hsu

(57) ABSTRACT

A MOCVD is performed to form a titanium nitride layer on the surface of a semiconductor substrate. Following that, a pulsed plasma treatment is performed to remove hydrocarbon impurities from the titanium nitride layer. Therein, the pulsed plasma treatment is performed in a pressure chamber comprising nitrogen gas ($N_2$) hydrogen gas ($H_2$) or argon gas (Ar). A pressure of the pressure chamber is controlled to between 1 to 3 Torr, with the power of the pressure chamber controlled to between 500 and 1000 watts.

15 Claims, 3 Drawing Sheets

METHOD OF FABRICATING AN MOCVD TITANIUM NITRIDE LAYER UTILIZING A PULSED PLASMA TREATMENT TO REMOVE IMPURITIES

BACKGROUND OF THE INVENTION

1. Field of the Invention

The present invention relates to a method of fabricating a titanium nitride layer, and more particularly, to a method of fabricating a titanium nitride layer to reduce thermal budget of the fabrication process as well as to remove hydro-carbon impurities within the titanium nitride layer.

2. Description of the Prior Art

In modern semiconductor processes, metal organic chemical vapor deposition (MOCVD) is gradually replacing the traditional sputtering process. The MOCVD uses metal organic compounds to form a thin metal film, such as tungsten (W), aluminum (Al), tantalum nitride (TaN) or titanium nitride (TiN), or a ferroelectric film, such as BaSrTaO$_x$ (BST), on a semiconductor substrate. However, using MOCVD also brings some disadvantages. For example, hydro-carbon impurities are also formed within the titanium nitride layer during the deposition process of the titanium nitride layer. As a result, the resistance of the titanium nitride layer is increased.

Please refer to FIG. 1 and FIG. 2. FIG. 1 and FIG. 2 are schematic diagrams of a method of fabricating a titanium nitride layer on a semiconductor wafer 10 according to the prior art. As shown in FIG. 1, the semiconductor wafer 10 comprises a silicon substrate 12, a bottom conducting layer 16 positioned on the silicon substrate 12, a dielectric layer 18 with a low dielectric constant (low K) positioned on the bottom conducting layer 16 as an inter-metal dielectric (IMD) layer, and a plurality of plug holes 20 positioned within the dielectric layer 18 (only a plug hole 20 is shown in FIG. 1). Therein, the bottom conducting layer 16 is an aluminum wire, and an anti-reflection coating (ARC) 17 of titanium nitride (TiN) is formed on the aluminum wire. As for the plug hole 20, it is used to form a tungsten plug therein in a later process, so as to electrically connect to the bottom conducting layer 16. The bottom conducting layer 16 functions as a gate, a source or a drain of a MOS transistor.

Following that, as shown in FIG. 2, a MOCVD is performed to deposit a titanium nitride layer 26 on the side wall of the plug hole 20, the titanium nitride layer 26 functioning as a barrier layer. The reaction of the MOCVD can be illustrated in the following reaction equation:

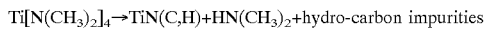

$$Ti[N(CH_3)_2]_4 \rightarrow TiN(C,H) + HN(CH_3)_2 + \text{hydro-carbon impurities}$$

As shown in the equation, after the deposition of the titanium nitride layer 26, some hydro-carbon impurities are also formed within the titanium nitride layer 26 by the MOCVD. As a result of the occurrence of the hydro-carbon impurities, the resistance of the titanium nitride layer 26 is increased and the uniformity of the products is affected.

In order to solve the above-mentioned problems, after the MOCVD is completed, a plasma treatment is required to remove the hydro-carbon impurities within the titanium nitride layer 26 and simultaneously densify the titanium nitride layer 26. However, the plasma treatment encounters some problems. During the plasma treatment, the silicon substrate 12 is often heated to above 420° C. and aluminum within the bottom conducting layer 16 may extrude to the surface of the titanium nitride layer 26 to affect the tungsten plug's RC value. In addition, under such a high temperature, the structure of the dielectric layer (low K IMD layer) 18 is damaged.

SUMMARY OF THE INVENTION

It is therefore a primary objective of the present invention to provide a method of fabricating a titanium nitride layer to reduce thermal budget and remove hydro-carbon impurities within the titanium nitride layer.

It is another objective of the present invention to solve the problem of aluminum extrusion.

It is still another objective of the present invention to prevent damage on the low K IMD layer.

According to the claimed invention, a MOCVD is used to form a titanium nitride layer on the surface of a semiconductor substrate. After that, a pulsed plasma treatment is performed to remove hydro-carbon impurities from the titanium nitride layer. Therein, the pulsed plasma treatment is performed in a pressure chamber. The pressure chamber comprises nitrogen gas (N$_2$), hydrogen gas (H$_2$) or argon gas (Ar). The pressure of the pressure chamber is controlled at between 1 and 3 Torr, and the power of the pressure chamber is controlled at between 500 and 1000 watts. In addition, a chiller is used to control temperatures cooling off the backside of the semiconductor substrate, so as to ensure the multi-step plasma treatment is performed with the temperature of the semiconductor substrate less than 390° C.

It is an advantage of the present invention that the temperature of the semiconductor substrate is prevented from going too high, so the characteristics of the semiconductor elements are not destroyed. In addition, the thermal budget of the fabrication process is reduced and the hydro-carbon impurities are effectively removed according to the present invention.

These and other objectives of the present invention will no doubt become obvious to those of ordinary skill in the art after reading the following detailed description of the preferred embodiment, that is illustrated in the various figures and drawings.

DETAILED DESCRIPTION OF THE PREFERRED EMBODIMENT

Figure 1:
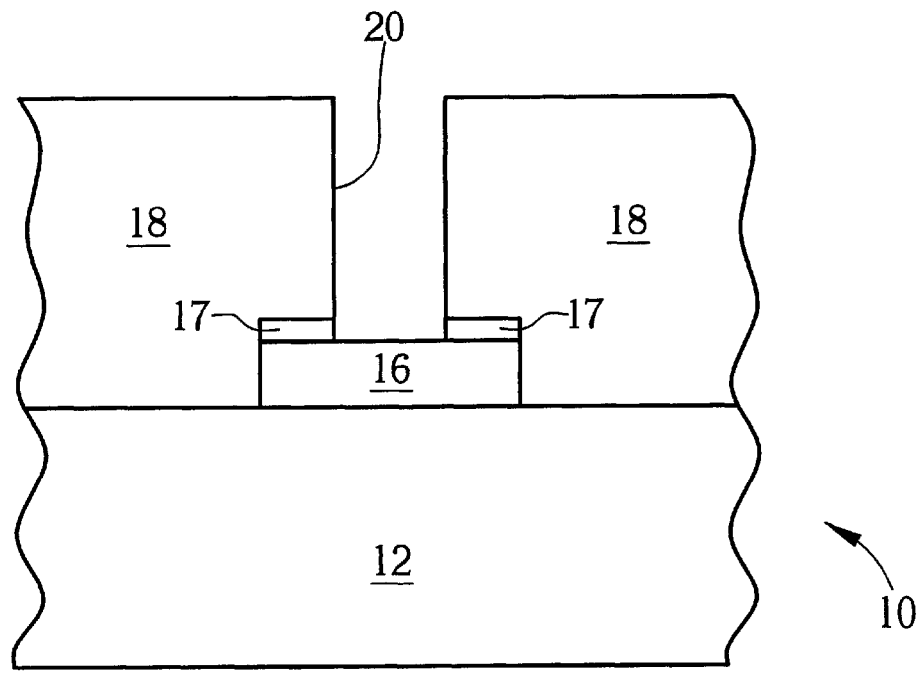
FIG. 1 and FIG. 2 are schematic diagrams of a method of fabricating a titanium nitride layer on a semiconductor wafer according to the prior art.
Figure 2:
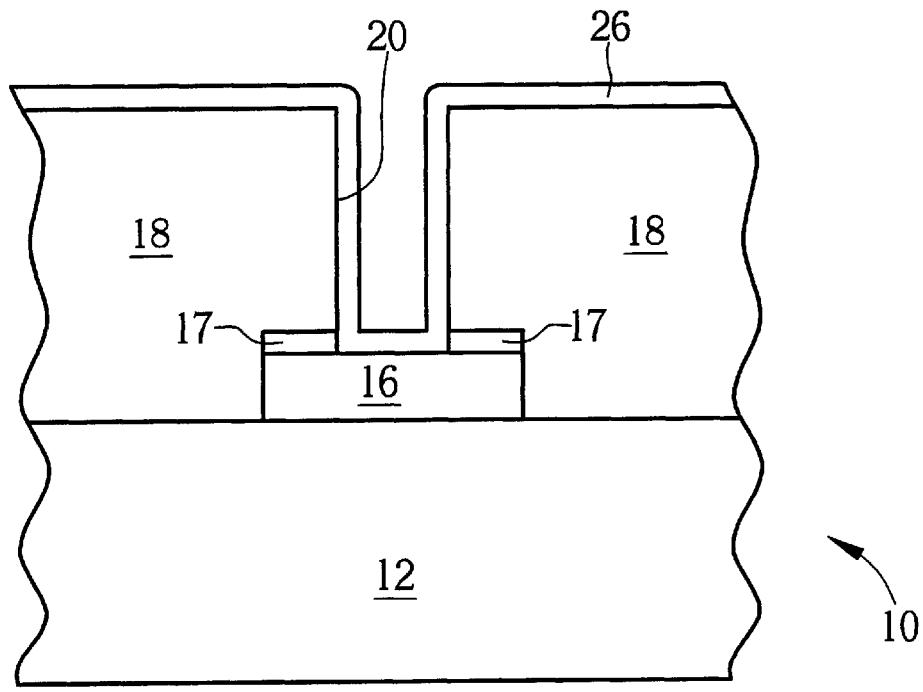
Figure 3:
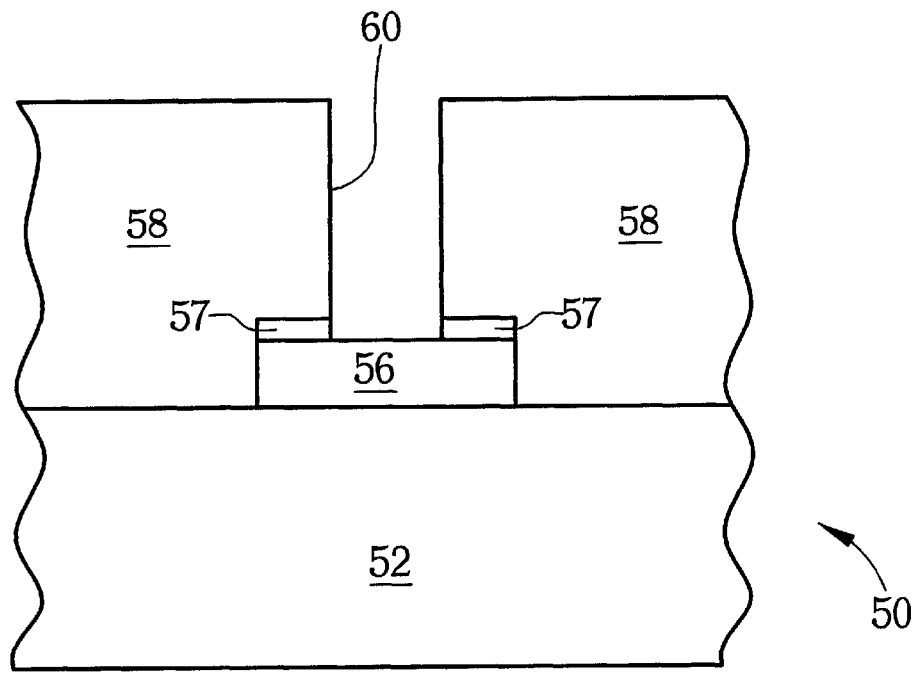
FIG. 3 and FIG. 4 are schematic diagrams of a method of fabricating a titanium nitride layer on a semiconductor wafer according to the present invention.
Figure 4:
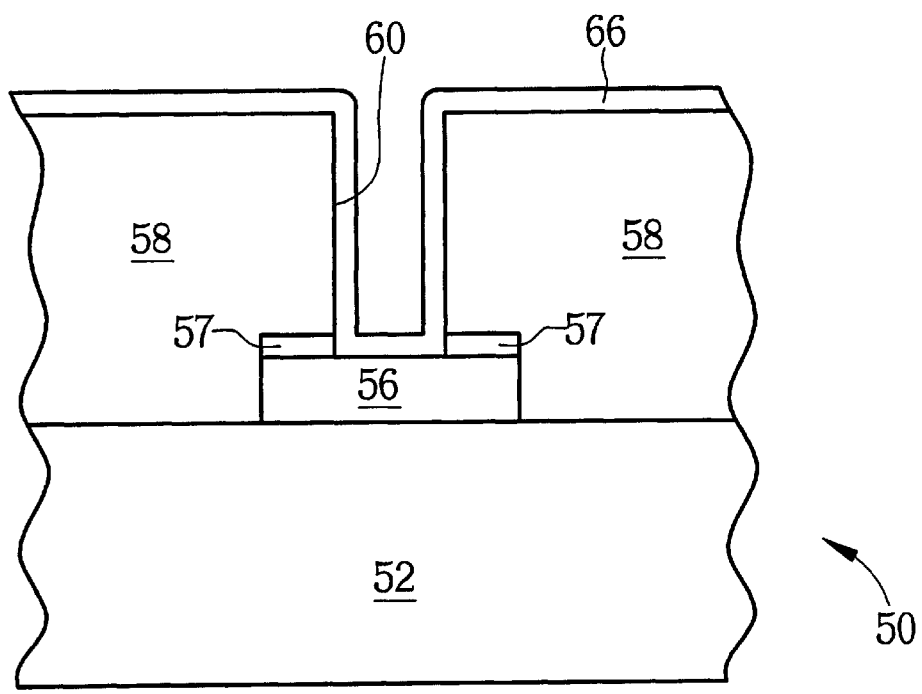

Please refer to FIG. 3 and FIG. 4. FIG. 3 and FIG. 4 are schematic diagrams of a method of fabricating a titanium nitride layer on a semiconductor wafer 50 according to the present invention. As shown in FIG. 3, the semiconductor wafer 50 comprises a silicon substrate 52, a bottom conducting layer 56 positioned on the silicon substrate 52, a low K dielectric layer 58 positioned on the bottom conducting layer 56, and a plurality of plug holes 60 positioned within the dielectric layer 58 (only a plug hole 60 is shown in FIG. 3). Therein, the bottom conducting layer 56 is a aluminum wire, and an anti-reflection coating (ARC) 57 of titanium nitride (TiN) is formed on the aluminum wire. The low K dielectric layer 58 functions as an inter-metal dielectric (IMD) layer. The plug hole 60, penetrating through both the dielectric layer 58 and the anti-reflection coating 57, is used to form a tungsten plug therein in a later process, so as to electrically connect to the bottom conducting layer 56.

Following that, as shown in FIG. 4, a MOCVD is performed to deposit a titanium nitride layer 66 to cover the surface of the plug hole 60, the titanium nitride layer 66 functioning as a barrier layer. During the MOCVD, tetrakis dimethyl amino titanium (TDMAT) is used as a precursor. In addition, the environment in which the MOCVD is performed also comprises nitrogen gas, hydrogen gas, or argon gas as a reactive gas. A reaction equation expressing the MOCVD is listed as:

$$Ti[N(CH_3)_2]_4 \rightarrow TiN(C,H) + HN(CH_3)_2 + \text{hydro-carbon impurities}$$

As shown in the equation, after the deposition of the titanium nitride layer 66, some hydro-carbon impurities are also formed within the titanium nitride layer 66 by the MOCVD. As a result of the hydro-carbon impurities, the resistance of the titanium nitride layer 66 is inevitably increased. Thus, after performing the MOCVD, a pulsed plasma treatment is required to remove the impurities within the titanium nitride layer 66 according to the present invention.

In a better embodiment of the present invention, the pulsed plasma treatment is performed in a pressure chamber with a pressure ranging between 1 to 3 Torr and a power ranging between 500 and 1000 watts. In addition, nitrogen gas, hydrogen gas, or argon gas is also introduced into the pressure chamber as a reactive gas. Therein, the pulsed plasma treatment, uses argon gas to remove the hydro-carbon impurities from the titanium nitride layer 66, uses hydrogen gas to carry away the hydro-carbon impurities, and uses nitrogen gas to supply nitrogen into the titanium nitride layer 66, so as to compensate nitrogen removed by the argon gas.

While using the pulsed plasma treatment to remove impurities within the titanium nitride layer 66, the power of the treatment and the flow rates of the gases must be controlled. When the treatment power is greater than 500 watts, the flow rates of both the nitrogen gas and the hydrogen gas must be controlled to between 100 and 500 sccm (standard cubic centimeters per minute) When the treatment power of the pulsed plasma treatment is less than 500 watts, the flow rates of both the nitrogen gas and the hydrogen gas must be controlled to between 1000 and 3000 sccm, so as to enhance cooling of the semiconductor wafer 50 to achieve a temperature of the silicon substrate 52 less than 390° C.

Figure 5:
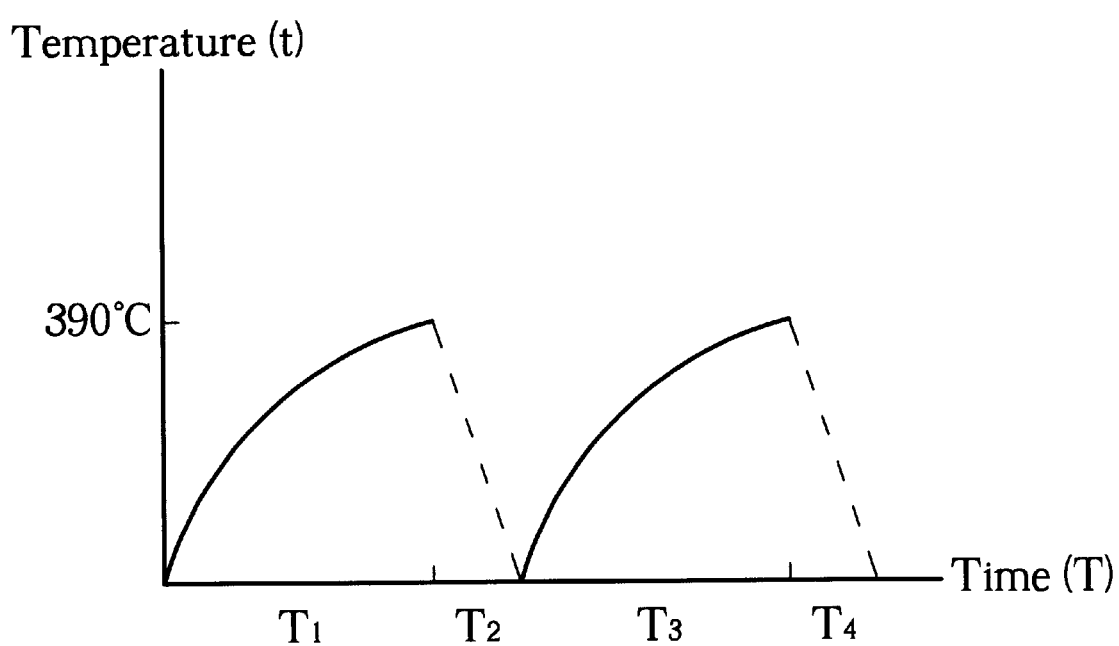
FIG. 5 is a relation diagram of time to temperature in a pulsed plasma treatment according to the present invention.

Specifically, in order to prevent the temperature of the silicon substrate 52 from getting too high, the operation time and power of the pulsed plasma treatment are controlled. As a result, a relation diagram of the operation time (T) to the temperature (t) of the silicon substrate 52 in a pulsed plasma treatment is shown in FIG. 5. Therein, a power greater than 500 watts (approximately in the range between 500 and 1000 watts) is used during the first period $T_1$, so as to control the temperature of the silicon substrate 52 to less than 390° C., thus removing the hydro-carbon impurities. While in the second period $T_2$, the power is less than 500 watts (approximately in the range between 0 and 500 watts), and nitrogen gas and hydrogen gas are introduced with a higher flow rate to remove the hydro-carbon impurities and supply nitrogen into the titanium nitride layer 66 to compensate nitrogen that had been removed by argon gas. As a result, the semiconductor wafer 50 is cooled, and the temperature of the silicon substrate 52 is controlled to less than 390° C.

Therein, within the first period $T_1$, the flow rates of both the nitrogen gas and the hydrogen gas range between 100 and 500 sccm. Within the second period $T_2$, the flow rates of both the nitrogen gas and the hydrogen gas range between 1000 and 3000 sccm. Subsequently, while turning to the third period $T_3$ and the fourth period $T_4$, the flow rates are equal to that within the first and the second periods, respectively. Similarly, the flow rates within the further periods $T_{n+1}$ and $T_{n+2}$ are again equal to that within $T_1$ and $T_2$, respectively.

According to the present invention, the temperature of the silicon substrate 52 is effectively controlled to less than 390° C. The situation of the semiconductor wafer 10 being heated to above 420° C., as in the prior art, does not happen. As a result, thermal budget of the fabrication process is reduced to prevent the structure of the dielectric layer 58 (low K IMD layer) from being damaged. In addition, the titanium nitride layer 66 is densified and the hydrocarbon impurities within the titanium nitride layer 66 are removed, thus improving the electrical performance of the semiconductor elements. Since a chiller is positioned in the pressure chamber to control a cooling temperature of the silicon substrate 52 according to the present invention, the pulsed plasma treatment is always performed at the temperature less than 390° C. Hence, the temperature of the silicon substrate 52 is prevented from getting too high, and problems resulting from the high temperature of the silicon substrate 52 are prevented.

According to a second embodiment of the present invention, a multi-step plasma treatment on the titanium nitride layer 66 is performed. The temperature of the silicon substrate 52 is kept less than 390° C. during each step of the plasma treatment, so as to remove the hydro-carbon impurities from the titanium nitride layer 66. For example, a first plasma treatment is firstly performed with flow rates of both the nitrogen gas and the hydrogen gas between 100 and 500 sccm. While the temperature of the silicon substrate 52 approaches 390° C., the first plasma treatment stops. Following that, the flow rates of both the nitrogen gas and the hydrogen gas are adjusted to between 1000 and 3000 sccm. When the temperature of the silicon substrate 52 is lowered to a temperature within a safe range, the flow rates of both the nitrogen gas and the hydrogen gas are adjusted back to between 100 and 500 sccm followed by performing a second plasma treatment on the titanium nitride layer 66. While the temperature of the silicon substrate 52 approaches 390° C., the second plasma treatment stops. The first and second plasma treatments are repeated until the hydro-carbon impurities are completely removed and the titanium nitride layer 66 is densified. In addition, a chiller may be positioned in the pressure chamber to assist cooling of the silicon substrate 52 during the plasma treatments.

In contrast to the prior art, the method of the present invention uses a pulsed plasma treatment or a multi-step plasma treatment, with higher flow rates of both nitrogen gas and hydrogen gas in the period of a smaller power. Thus, the temperature of the silicon substrate is effectively controlled to less than 390° C. The problems resulting from the high temperature of the silicon substrate that occur in the prior art, are prevented.

Those skilled in the art will readily observe that numerous modifications and alterations of the method may be made while retaining the teachings of the invention. Accordingly, the above disclosure should be construed as limited only by the metes and bounds of the appended claims.

What is claimed is:

1. A method of fabricating a titanium nitride (TiN) layer on a semiconductor substrate, the method comprising:

providing a semiconductor substrate;

performing a metal organic chemical vapor deposition (MOCVD) process to form the titanium nitride layer on the surface of the semiconductor substrate; and providing a varying power to perform a pulsed plasma treatment on the titanium nitride layer to remove impurities within the titanium nitride layer.

2. The method of claim 1 wherein the metal organic chemical vapor deposition process is performed in a TDMAT (tetrakis dimethyl amino titanium)-containing environment.

3. The method of claim 2 wherein the environment further comprises nitrogen gas ($N_2$), hydrogen gas ($H_2$) or argon (Ar) gas.

4. The method of claim 1 wherein the pulsed plasma treatment is performed in a chamber with a pressure between 1 to 3 torr, and a power between 500 to 1000 watts.

5. The method of claim herein the chamber comprises nitrogen gas ($N_2$), hydrogen gas ($H_2$) or argon (Ar) gas.

6. The method of claim 1 wherein the pulsed plasma treatment is performed in a chamber comprising nitrogen gas and hydrogen gas, and while the pulsed plasma treatment uses a power greater than 500 watts, flow rates of both the nitrogen gas and the hydrogen gas range from 100 to 500 sccm (standard cubic centimeter per minute), and a temperature of the semiconductor substrate is less than 390° C.

7. The method of claim 1 wherein the pulsed plasma treatment is performed in a chamber comprising nitrogen gas and hydrogen gas, and while the pulsed plasma treatment uses a power less than 500 watts, flow rates of both the nitrogen gas and the hydrogen gas range from 1000 to 3000 sccm.

8. The method,of claim 1 wherein the chamber comprises a chiller to control temperature by cooling off the backside of the semiconductor substrate, so that the semiconductor substrate has a temperature less than 390° C.

9. The method of claim 1 wherein the impurities within the titanium nitride layer comprise hydro-carbon impurities, and the titanium nitride layer functions as a barrier layer.

10. A method of removing hydro-carbon impurities within a titanium nitride (TiN) layer, the titanium nitride layer being formed on a semiconductor substrate by a metal organic chemical vapor deposition (MOCVD) process, the method comprising:

positioning the semiconductor substrate within a pressure chamber; and.

performing a multi-step plasma treatment on the titanium nitride layer, a temperature of the semiconductor substrate being controlled to less than 390° C., so as to remove the hydro-carbon impurities within the titanium nitride layer.

11. The method of claim 10 wherein a pressure of the pressure chamber is controlled to between 1 to 3 torr, and a power of each step of the plasma treatment is controlled to between 500 to 1000 watts.

12. The method of claim 10 wherein each step of the plasma treatment is performed in a nitrogen gas ($N_2$)-containing and hydrogen gas ($H_2$)-containing environment, and each step of the plasma treatment comprises:

controlling flow rates of the nitrogen gas and the hydrogen gas to within a first range, the first range ranging from 100 to 500 sccm;

within the first range, performing a plasma treatment on the titanium nitride layer until a temperature of the semiconductor substrate approaches 390° C.; and controlling flow rates of the nitrogen gas and the hydrogen gas to within a second range when the temperature of the semiconductor substrate approaches 390° C. the second range ranging from 1000 to 3000 sccm.

13. The method of claim 10 wherein the metal organic chemical vapor deposition process is performed in a TDMAT (tetrakis dimethyl amino titanium)-containing environment.

14. The method of claim 10 wherein the pressure chamber comprises a chiller to cool the semiconductor substrate.

15. The method of claim 15 wherein the titanium nitride layer functions as a barrier layer.

* * * * *